United States Patent [19]
Solal et al.

[11] Patent Number: 6,043,726
[45] Date of Patent: Mar. 28, 2000

[54] SURFACE ACOUSTIC WAVE FILTER UTILIZING THE COUPLING OF THREE ACOUSTIC PATHWAYS

[75] Inventors: Marc Solal, Antibes; Jean Desbois, Roquefort les Pins, both of France

[73] Assignee: Thomson-CSF, Paris, France

[21] Appl. No.: 09/043,570

[22] PCT Filed: Sep. 20, 1996

[86] PCT No.: PCT/FR96/01469

§ 371 Date: Mar. 25, 1998

§ 102(e) Date: Mar. 25, 1998

[87] PCT Pub. No.: WO97/12441

PCT Pub. Date: Apr. 3, 1997

[30] Foreign Application Priority Data

Sep. 26, 1995 [FR] France ................................ 95 11267

[51] Int. Cl.[7] .............................................. H03H 9/64
[52] U.S. Cl. ................................... 333/195; 310/313 D
[58] Field of Search .............................. 333/193–196; 310/313 R, 313 B, 313 C, 313 D

[56] References Cited

U.S. PATENT DOCUMENTS

| | | | |
|---|---|---|---|
| 3,962,673 | 6/1976 | Desbois et al. ........................... 367/7 |
| 4,069,507 | 1/1978 | Defranould et al. ..................... 348/198 |
| 4,099,206 | 7/1978 | Desbois et al. ......................... 348/198 |
| 4,146,783 | 3/1979 | Desbois et al. ......................... 359/130 |
| 4,916,416 | 4/1990 | Desbois .................................. 333/195 |
| 5,020,034 | 5/1991 | Solal et al. .............................. 367/138 |
| 5,264,751 | 11/1993 | Dufilie et al. ......................... 310/313 B |
| 5,365,138 | 11/1994 | Saw et al. ............................ 310/313 D |
| 5,374,908 | 12/1994 | Wright ............................. 310/313 D X |
| 5,475,348 | 12/1995 | Hode et al. ............................. 333/195 |
| 5,581,141 | 12/1996 | Yamada et al. ...................... 333/195 X |
| 5,703,427 | 12/1997 | Solal et al. .......................... 310/313 D |
| 5,790,000 | 8/1998 | Dai et al. ............................. 333/194 X |
| 5,793,266 | 8/1998 | Allen et al. ............................. 333/193 |
| 5,821,834 | 10/1998 | Xu et al. ................................ 333/193 |
| 5,835,990 | 11/1998 | Saw et al. ........................... 310/313 D |

FOREIGN PATENT DOCUMENTS

| | | | |
|---|---|---|---|
| 0 648 015 A2 | 4/1995 | European Pat. Off. . | |
| 2 682 833 A1 | 4/1993 | France . | |
| 44 39 489 C1 | 1/1996 | Germany ................. 333/193 |
| 63-155810 | 6/1988 | Japan . | |
| 63-285018 | 11/1988 | Japan ..................... 333/195 |
| 3-222512 | 10/1991 | Japan ..................... 333/195 |

OTHER PUBLICATIONS

B. Wall et al.; "Balanced Driven Transversely Coupled Waveguide Resonator Filters"; *IEEE Ultrasonics Symposium*; Nov. 3–6, 1996, San Antonio, TX, USA; pp. 47–51.

M.A. Sharif et al.; "Coupled Resonator Filters with Differential Input And/or Differential Output"; *IEEE Ultrasonics Symposium*; Nov. 7–10, 1995, Seattle, WA, USA; pp; 67–70.

*Primary Examiner*—Robert Pascal
*Assistant Examiner*—Barbara Summons
*Attorney, Agent, or Firm*—Oblon, Spivak, McClelland, Maier & Neustadt, P.C.

[57] ABSTRACT

A surface acoustic wave filter having three acoustic pathways. The first acoustic pathway is made up of a first transducer including a first and second bonding pad and is arranged between two reflectors to form a first resonator. The second acoustic pathway is made of a second transducer including a third and fourth bonding pad and is arranged between two reflectors to form a second resonator. A third acoustic pathway is made of a third transducer including a fifth and sixth bonding pad and is arranged between two reflectors to produce a third resonator. Each bonding pad of the transducers is linked to a specified potential.

18 Claims, 8 Drawing Sheets

SURFACE ACOUSTIC WAVE FILTER UTILIZING THE COUPLING OF THREE ACOUSTIC PATHWAYS

BACKGROUND OF THE INVENTION

1. Field of the Invention

The present invention relates to a surface acoustic wave filter having resonators with transverse coupling utilizing the coupling of three acoustic pathways. Surface acoustic wave filters are used in numerous applications, in particular in portable telephones.

2. Discussion of the Background

Such filters utilize the propagation of acoustic waves over the surface of a piezoelectric substrate, and the filtering characteristics stem from the modifications made to the propagation of these waves as a function of their frequency by electrodes suitably arranged on the surface of the substrate. There are several structures for these electrodes and a choice is made between them depending on the results to be obtained. Among these structures, those which utilize resonators transversely coupled by proximity are more particularly known.

In FIG. 1, the structure of the electrodes of a two-pole filter utilizing transverse-coupling resonators is represented. For the sake of clarity, the structure described here is very simple and in particular has a small number of fingers for the electrodes, which would give rise to relatively mediocre filtering performance of a filter made identically to this structure. However, this structure is very characteristic of filters of this type and practical implementations differ essentially through an increase in the number of fingers.

This two-pole filter consists of two resonators each formed of a transducer situated between two reflector arrays and coupled by proximity. The transducers and the reflector arrays have a metallization period of around half a wavelength. The first resonator is linked to the input of the filter and the second resonator to the output.

The input resonator comprises an electrode 1 in the shape of a comb whose fingers are interdigitated with the fingers of an earth electrode 2. The acoustic waves thus generated by this transducer are transmitted towards the right and towards the left towards reflectors 3 and 4 formed by fingers parallel to the fingers of the transducers and obtained by slitting the earth electrode 2. The resonator linked to the output is symmetric with this resonator linked to the input with respect to an axis parallel to the direction of propagation of the acoustic waves generated by the input resonator. It comprises a transducer 5 and two reflectors 6 and 7. With the earth being common, here the corresponding earth electrode 2 is in one piece and is linked here to two earth outputs 8 and 9 and solely for bonding purposes to the circuit outside the filter. It would be possible either to use just a single earth output or to separate the earths.

The two resonators are coupled by bringing them close together according to the layout of FIG. 1. Under these conditions, in first order of approximation the structure may be regarded as being equivalent to that obtained by bringing two waveguides close together. Each of the propagation modes of the guides considered on its own is transformed into two modes, a symmetric mode and an antisymmetric mode.

When the distance between the two resonators is large, the velocities of the acoustic waves in these two modes are very similar and substantially equal to the velocity of the mode of an isolated guide. The coupling is then very weak, this being all the more evident the further apart the resonators. As the distance between the two resonators decreases, the velocities of the waves in the two modes diverge and the coupling increases.

It can be shown that the equivalent diagram of such a structure corresponds to that obtained for two resonators coupled with a coupling equal to a normalized discrepancy between the frequencies $f_s$ and $f_a$, of the two respectively symmetric and antisymmetric modes given by the following formula:

$$k = 2\frac{f_a - f_s}{f_a + f_s}$$

This coupling thus defines the relative passband which can be obtained with this kind of filter.

In general, with a two-pole filter, too little rejection is obtained and the sides of the passband are too shallow. It is then expedient to produce filters with four or six poles, or even more quite simply by cascading several two-pole structures.

Represented in FIG. 2 is the structure of the filter previously described and illustrated by FIG. 1. The drawing is simplified by representing the elements by rectangles in which the fingers of the electrodes have not been depicted so as to make the representation more readable. The electrodes inside these rectangles would be drawn in accordance with the rules well known to a person skilled in the art.

The elements which are the counterpart of those of FIG. 1 are denoted by the same labels. This presentation will be retained for the other figures appended to the present description.

From this basic structure, illustrated in FIGS. 1 and 2, other known filter structures are produced. Among them, that illustrated in FIG. 3. This structure relates to a two-pole filter with differential inputs IN+, IN− and non-differential output OUT employing four acoustic pathways 10, 11, 12 and 13.

The symmetry of such a filter is obtained by paralleling two filters 14 and 15 of identical intrinsic structure but whose differential inputs have been inverted. In the structure of each of the two filters 14 and 15, the central bus 2 corresponding to the earth buses in the filter of FIGS. 1 and 2 is no longer common to the two poles but separated into two distinct buses: an earth bus 16, 17 and a bus 18, 19 linked to one of the differential inputs. To obtain low input impedance, the transducers are connected directly between the differential inputs. The inverting of the inputs is offset by inverting the polarities of the transducers. The drawback of such a structure resides in the width of the substrate required to produce the filter.

SUMMARY OF THE INVENTION

The object of the present invention is to overcome the aforementioned drawbacks.

To this end, the subject of the invention is a surface acoustic wave filter having resonators with transverse coupling, comprising three acoustic pathways coupled by proximity, characterized in that:

the first acoustic pathway made up of a first transducer, comprising a first and a second bonding pad, and arranged between a first reflector and a second reflector, forms a first resonator, the second acoustic pathway made up of a second transducer, comprising a third bonding pad and a fourth bonding pad, and arranged between a third reflector and a fourth reflector, forms a second resonator, and the third acoustic pathway made up of a third transducer, comprising a fifth and a sixth bonding pad, and arranged between a fifth reflector and a sixth reflector, forms a third resonator, and in that each bonding pad of the transducers is linked to a specified potential and in that the second resonator is connected in differential mode.

The main advantage of the filter according to the invention is therefore that of reducing the bulkiness of the filter which may be an important constraint in portable hardware.

BRIEF DESCRIPTION OF THE DRAWINGS

Other advantages and characteristics of the present invention will emerge more clearly on reading the description which follows given with reference to the appended figures which represent.

DISCUSSION OF THE PREFERRED EMBODIMENTS

The counterpart elements of FIGS. 4 to 11 are denoted with the same label.

Figure 4:
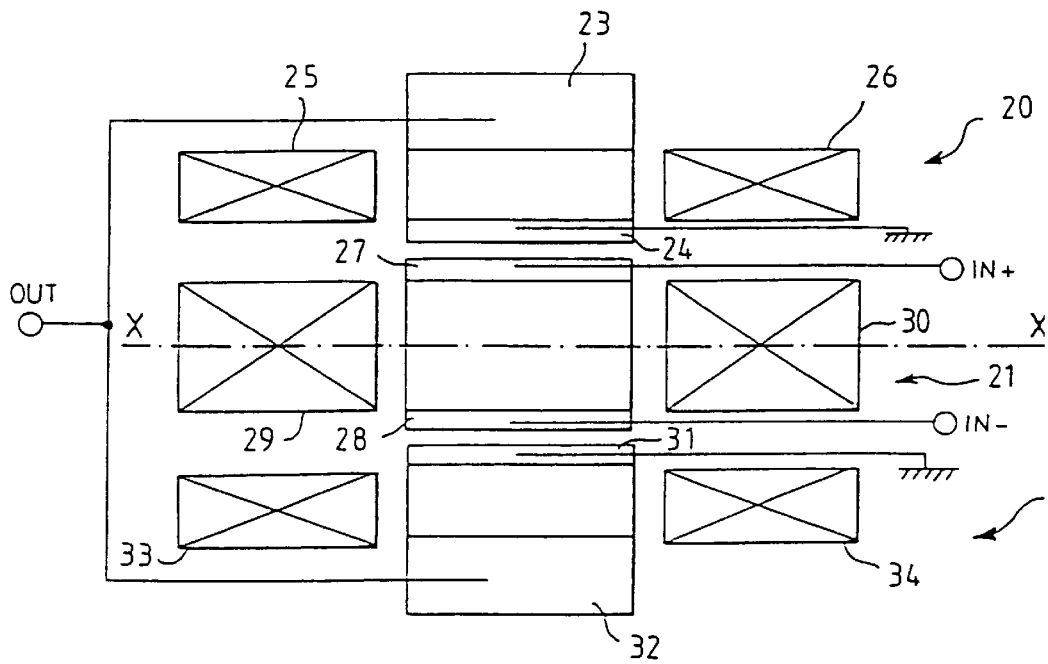

FIG. 4 illustrates a filter structure with three acoustic pathways 20, 21, and 22 according to the invention with differential inputs IN+, IN– and non-differential output OUT. The three acoustic pathways 20, 21 and 22 are each formed of a resonator and are coupled together by being close.

A resonator is formed from a transducer arranged between two reflectors.

A transducer consists of two electrodes forming two interleaved combs, each comprising a bonding pad intended to be linked to a specified potential.

To simplify the representation of the filter structures according to the invention, the transducers in the figures appended to the present description appear in the form of rectangles wherein may be distinguished the bonding pads relating respectively to each electrode comb (not represented). The labels associated with the bonding pads will serve subsequently in defining each transducer.

The first resonator, formed of a first transducer comprising a first bonding pad 23 and a second bonding pad 24, is arranged between a first reflector 25 and a second reflector 26 so as to form the first acoustic pathway 20.

The second resonator, formed from a second transducer comprising a third bonding pad 27 and a fourth bonding pad 28, is arranged between a third reflector 29 and a fourth reflector 30 so as to form the second acoustic pathway 21.

The third resonator, formed from a third transducer comprising a fifth bonding pad 31 and a sixth bonding pad 32, is arranged between a fifth reflector 33 and a sixth reflector 34 so as to form the third acoustic pathway 22.

The two outer transducers 23, 24 and 31, 32 in respect of the first and of the third pathway 20 and 22, are connected in parallel to the non-differential output OUT. The first bonding pad 23 and the sixth bonding pad 32 are both linked to the non-differential output OUT. The second bonding pad 24 and the fifth bonding pad 31 are both linked to a reference potential, for example earth.

Figure 3:
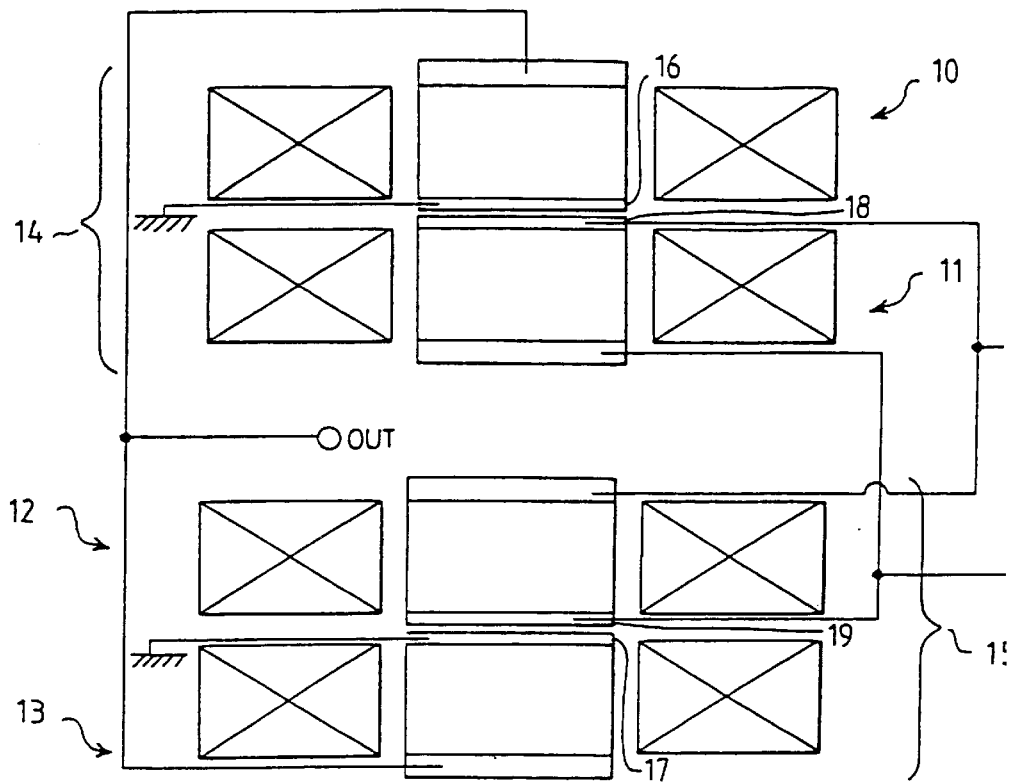

The central transducer 27, 28, in respect of the second pathway 21, is connected to the differential inputs IN+, IN–. The third bonding pad 27 is linked to one of the differential inputs IN+ and the fourth bonding pad 28 is linked to the other differential input IN–. This structure is symmetric with respect to a horizontal axis XX' passing through the middle of the central transducer 27, 28. The propagation modes which exist in this structure are therefore either symmetric modes or asymmetric modes. Since the electrical excitation is symmetric, only the symmetric modes are coupled. Only the first two symmetric modes are used. As compared with the structure of the filter of the prior art illustrated in FIG. 3, the advantage lies in a smaller useful width of filter support substrate, with an input impedance having the same order of magnitude.

The widths of the two outer pathways 20 and 22 formed respectively by the first and the third resonator are identical so as to retain a symmetric structure. To obtain the same coupling for the two symmetric modes used, the widths of the outer pathways 20 and 22 can be chosen to be similar to the width of the central pathway 21.

Figure 5:
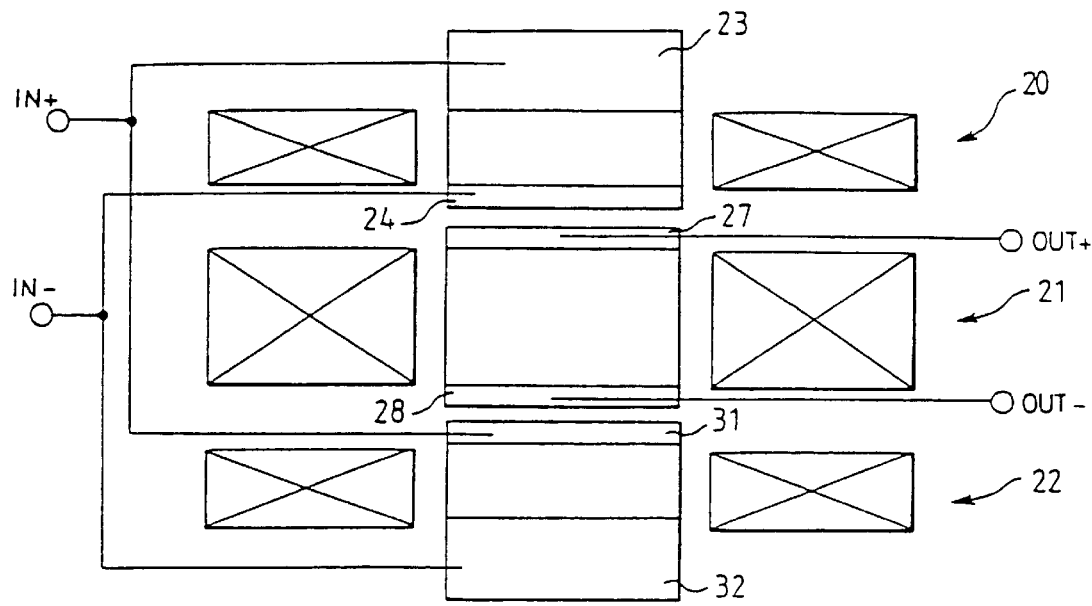

It is also possible to utilize a structure with three acoustic pathways in order to produce a two-pole filter with differential inputs and outputs. This structure is illustrated in FIG. 5. The central transducer 27, 28 is connected between the two differential outputs OUT– and OUT+while the two transducers 23, 24 and 31, 32 of the outer pathways 21 and 22 are connected in parallel between the two differential inputs IN– and IN+. In order to keep the two inputs IN+ and IN– symmetric, the first differential input IN+ is linked to the first bonding pad 23 and to the fifth bonding pad 31 while the second differential input IN– is linked to the second and to the sixth bonding pad 24 and 32. The two differential inputs IN+, IN– being respectively linked to a narrow bonding pad, 31 and 24, and to a wide bonding pad 23 and 32. The impedances as seen by the two differential inputs IN+, IN– are therefore identical. The third bonding pad 27 and the fourth bonding pad 28 are linked respectively to one of the differential outputs OUT+, OUT–. In order to re-establish the symmetry of the electrical excitation despite the inverting of the bonding to the outer transducers 23, 24 and 31, 32, it is merely necessary to invert the polarities of the electrodes of the two transducers. Owing to the reciprocity property of the surface acoustic waves, the inputs and the outputs can be inverted.

Figure 6:
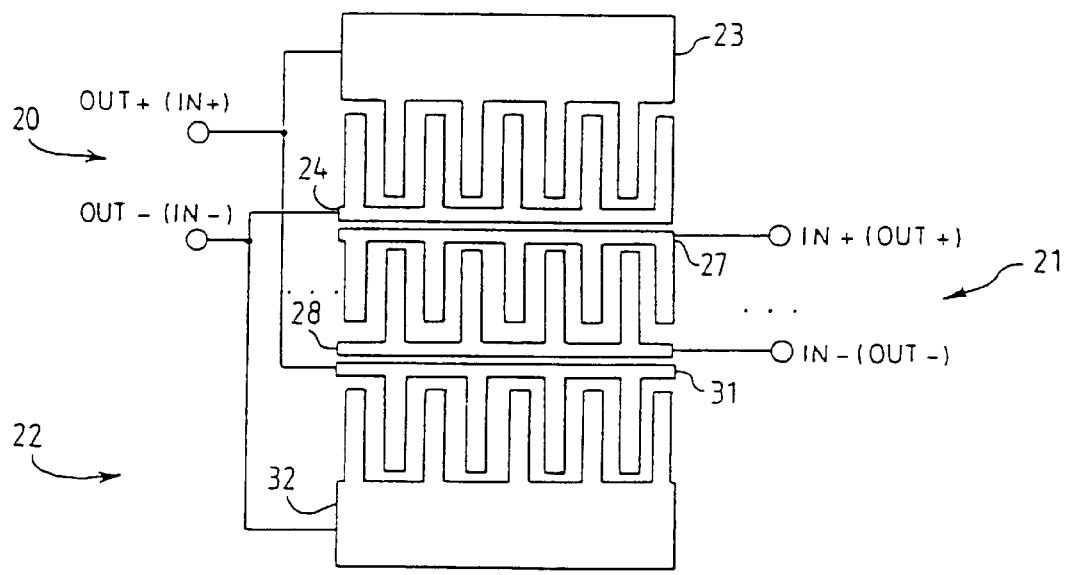

FIG. 6 illustrates a schematic structure relating to the filter structure of FIG. 5 wherein may be distinguished the inverting of the polarity of the electrodes integral with the bonding pads. This structure relates to a two-pole filter with differential inputs and outputs. Unlike a mixed structure, it is possible to choose the inputs and the outputs. The input is taken for example on the central pathway 21 or on the other two pathways 20 and 22. The use of the outer pathways as filter input may be favourable in the case where it is sought to reduce the source impedance and load impedance.

The structures just described correspond to two-pole filters. In fact, it is more generally multipole filters which are produced, utilizing a number N of poles, greater than two, with differential or non-differential inputs and outputs. It is in particular possible to produce a four-pole filter structure comprising two stages, each stage corresponding to structures with three acoustic pathways similar to those just described.

Figure 7:
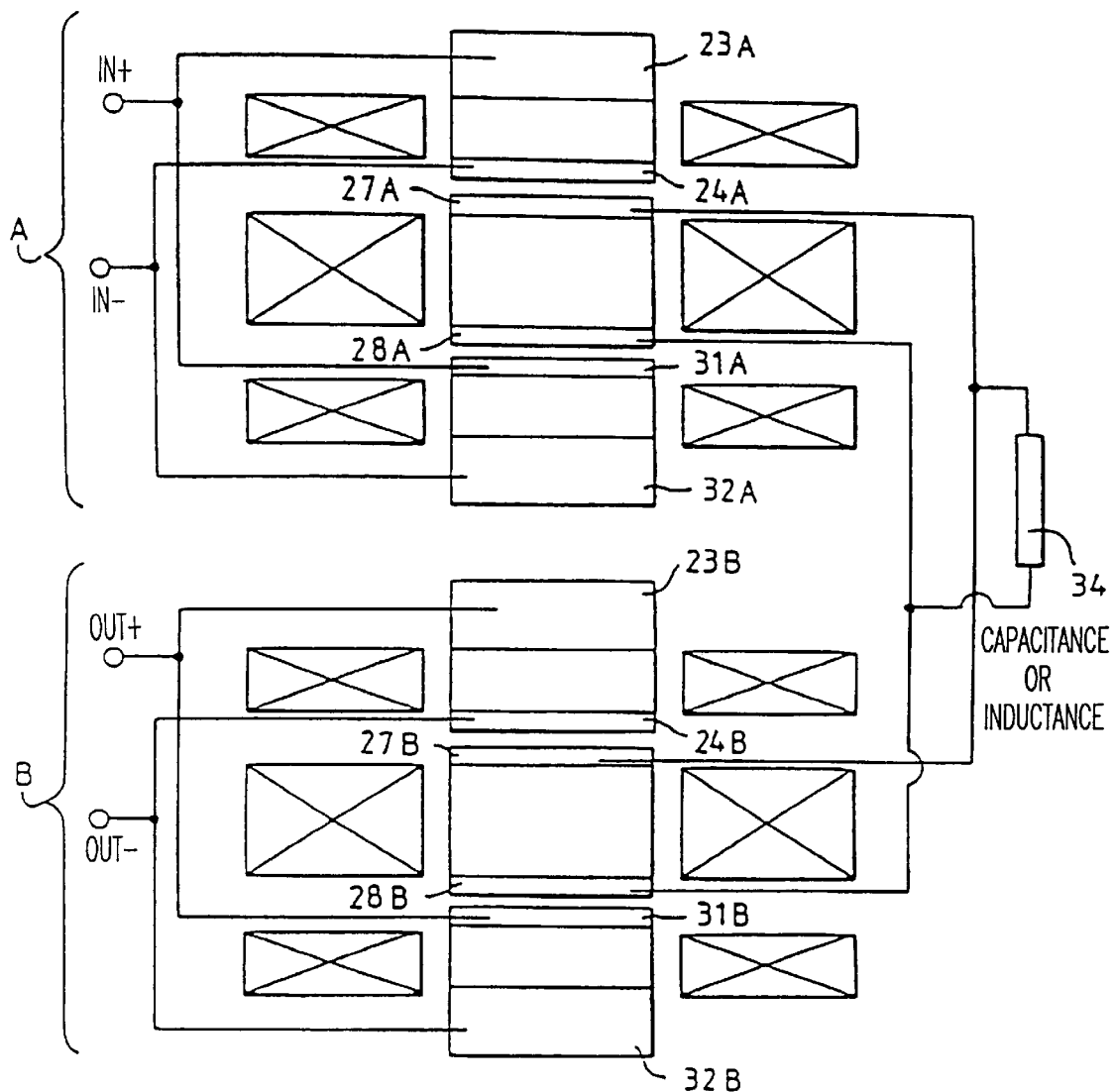

A first structure of a four-pole filter with differential inputs and outputs and differential coupling is illustrated in FIG. 7. This structure is built by cascading two two-pole filters with differential inputs and outputs of the type of that illustrated in FIG. 5. The first and second stages A and B are coupled in differential mode by means of a coupling circuit 34, consisting for example, of an inductance or of a capacitance connected in parallel. The connecting up of the central transducers 27A, 28A and 27B, 28B in respect of the first stage A and of the second stage B, that is to say the connecting up of the first 23A, 23B, second 24A, 24B, fifth 31A, 31B and sixth 32A, 32B bonding pads of the two stages A and B to the central stages of the two stages, is identical to the connecting up of the structure of FIG. 5. The two stages A and B are coupled by way of the third and fourth bonding pads 27A, 27B and 28A, 28B in respect of the first and second stages A and B, the coupling circuit 34 consisting for example of an inductance, or of a coupling capacitance in parallel interposed between these bonding pads.

Figure 8:
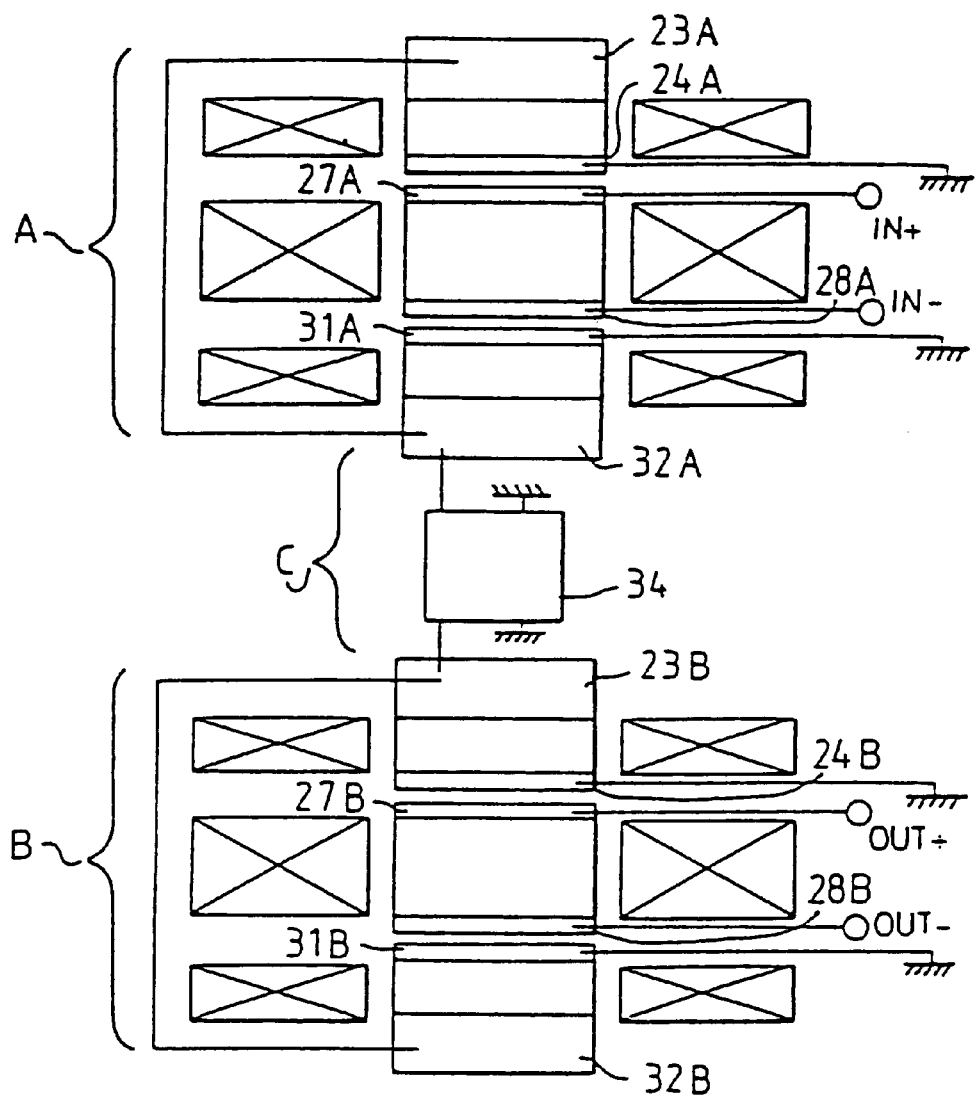

FIG. 8 illustrates a four-pole filter structure with differential inputs and outputs and non-differential coupling of the two stages A and B. The connecting of the first and second stages A and B of the structure represented in FIG. 8 is similar to that represented in FIG. 4. The central transducers of the two stages are linked respectively to the differential inputs IN+ and IN− and to the differential outputs OUT+ and OUT−, and the outer transducers of each of the two stages are connected in parallel. The third and fourth bonding pads 27A, 28A and 27B, 28B of each stage A and B are linked respectively to one of the differential inputs and outputs IN+, IN−/OUT+, OUT− and the second and fifth bonding pads 24A, 31A and 24B, 31B of each stage A and B are linked to the same reference potential, for example earth. The first and sixth bonding pads 23A, 32A and 23B, 32B of each stage A and B are linked together and allow the coupling of the first stage A with the second stage B by way of the coupling circuit 34; the pads 23A and 32A thus constituting the output of the first stage A and the pads 23B and 32B the input of the second stage B.

The structures of FIGS. 7 and 8 have the same function: four-pole filter with differential inputs and outputs. The structure of FIG. 8 allows simpler connecting and hence will generally be preferred. The advantage of differential coupling is that it makes it equally possible to produce the inputs and the outputs of the four-pole filter on the central transducers or on the outer transducers, and this may make it possible to reduce the impedances of sources and load impedance.

Figure 1:
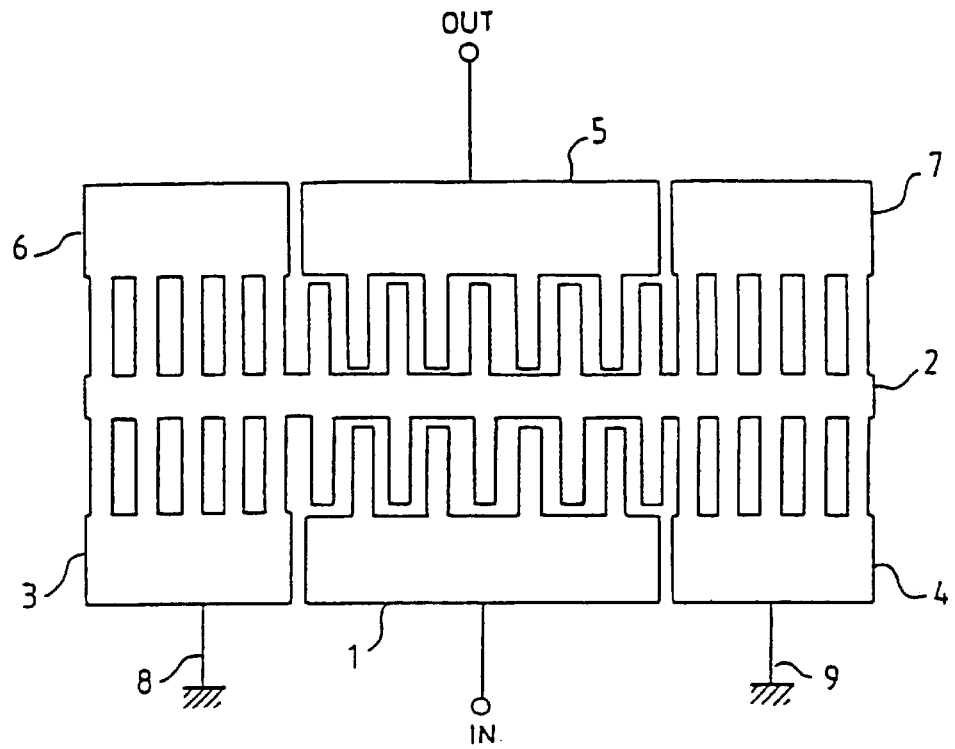
FIG. 1 already mentioned, a first known structure of a two-pole filter with transverse coupling, FIG. 2 already mentioned, a simplified representation of the filter of FIG. 1, FIG. 3 already mentioned, the structure of a two-pole filter comprising four acoustic pathways, FIG. 4, the structure of a two-pole filter with three acoustic pathways according to the invention with differential inputs and non-differential output, FIG. 5, a structure of a filter with three acoustic pathways according to the invention with differential inputs and outputs, FIG. 6, a detailed structure of the filter with three acoustic pathways with differential inputs and outputs of FIG. 5, FIG. 7, a four-pole filter structure, according to the invention with differential inputs and outputs and differential coupling, FIG. 8, a four-pole filter structure according to the invention with differential inputs and outputs and non-differential coupling, FIG. 9, a four-pole filter according to the invention with differential inputs and non-differential output and non-differential coupling, FIG. 10, a four-pole filter structure according to the invention with non-differential inputs and outputs and differential coupling, FIG. 11, a six-pole filter structure with differential inputs/outputs and non-differential coupling according to the invention.
Figure 2:
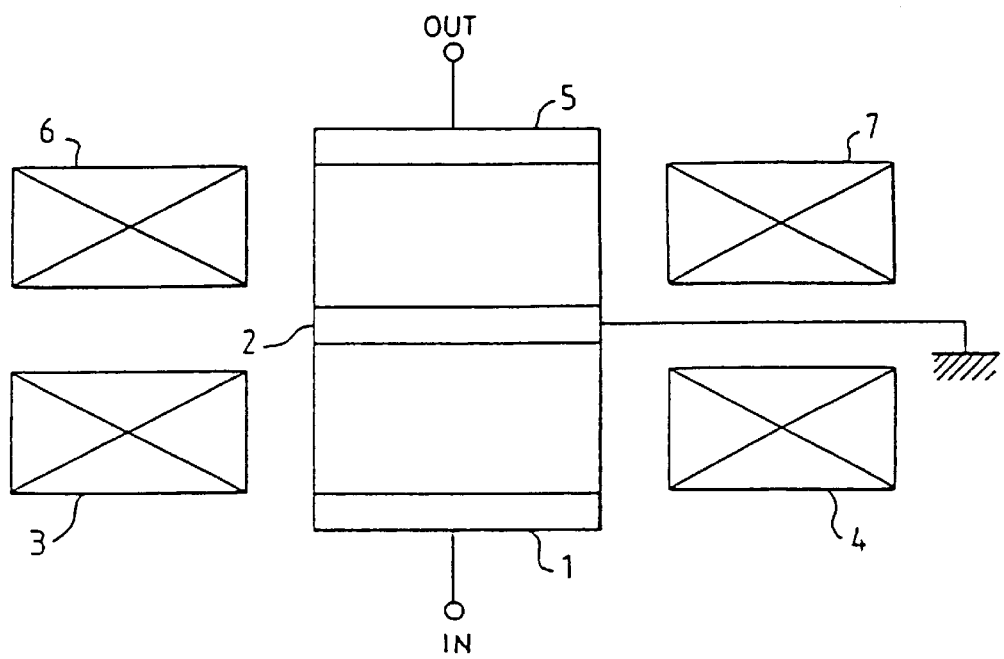
Figure 9:
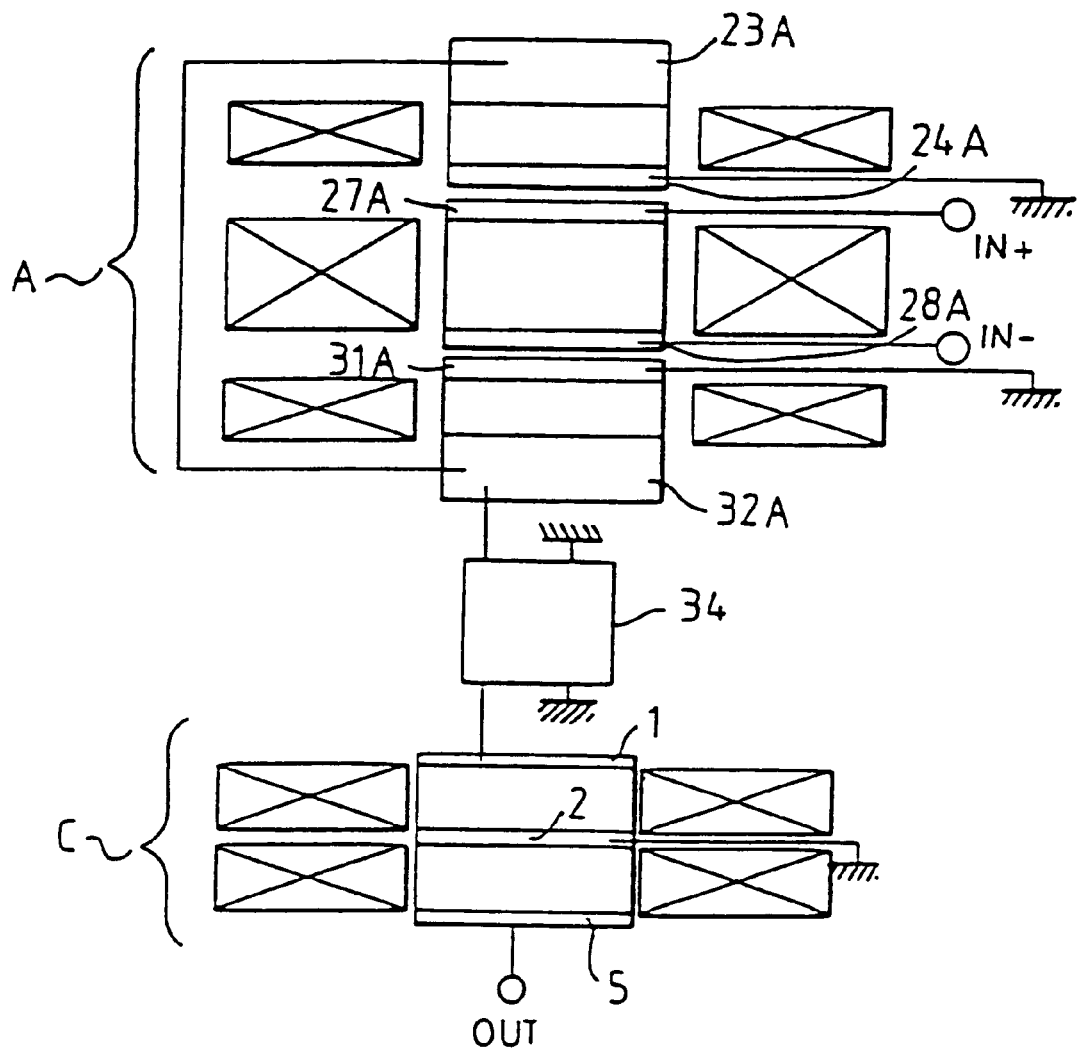

By combining a two-pole filter structure with three pathways, A, according to the invention together with a two-pathway filter C such as that represented in FIG. 1 of the prior art, a four-pole filter with differential inputs and non-differential output and with non-differential coupling is obtained, as illustrated in FIG. 9. The connecting of the filter with three acoustic pathways according to the invention is identical to that of the first stage A of the filter structure described in FIG. 8 and is therefore not redescribed. The three-pathway filter A and the two-pathway filter C are coupled by way of a coupling circuit 34 of the same type as that described previously. The coupling circuit 34 is placed between the bonding pads 23A and 32A of the outer transducers of the first stage A and the first bonding pad 1 of the two-pathway filter C. The non-differential output OUT is taken on the fourth bonding pad 5 of the two-pathway filter C. One and the same bus 2 common to the two poles of the two-pathway filter C is linked to a reference potential, for example earth.

Figure 10:
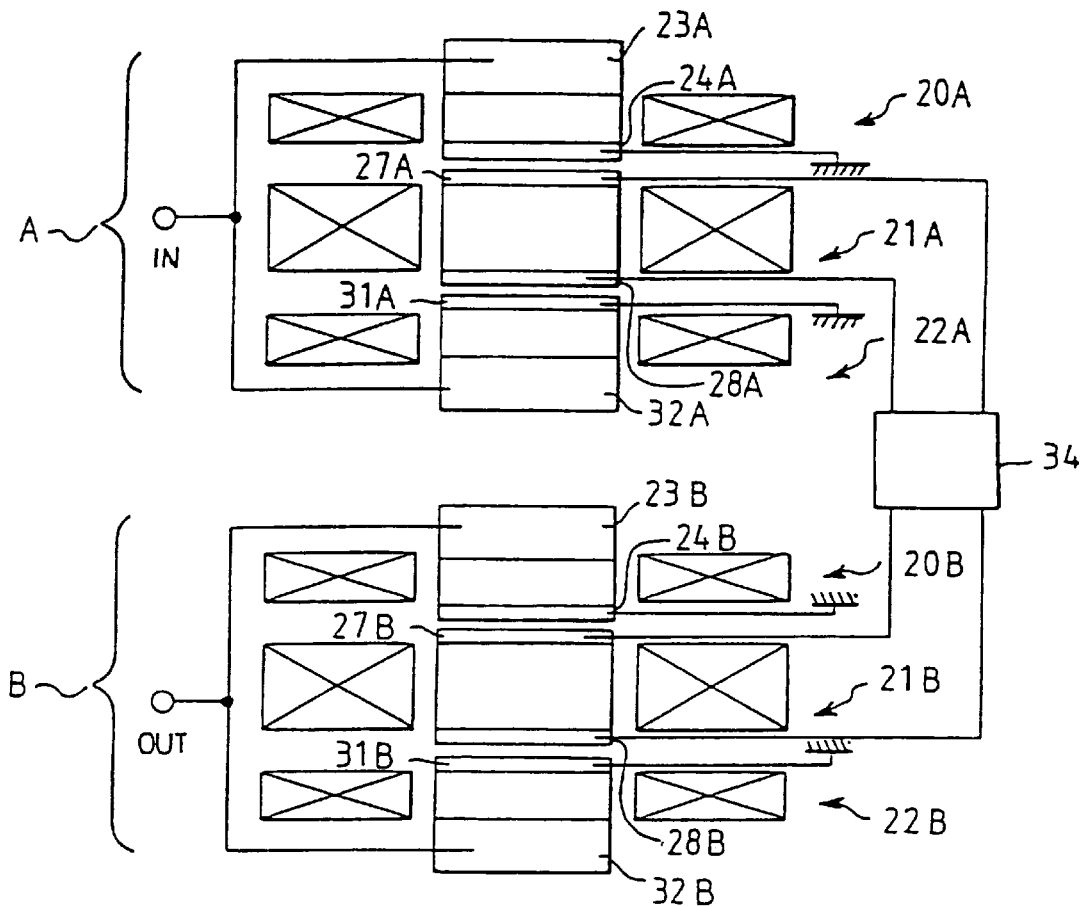

FIG. 10 illustrates another four-pole filter structure according to the invention based on two stages A and B and in which the inputs and outputs are non-differential while utilizing differential coupling. In this structure, the connecting of the outer pathways of each stage, that is to say the connecting of the first and third pathways 20A, 22A and 20B, 22B of each stage A and B, is identical to the connecting of the filter structure illustrated in FIG. 4 and is therefore not redescribed. The two stages A and B are coupled by means of the coupling circuit 34 arranged between the central pathway 21A and 21B of each stage A and B.

This structure makes it possible to decrease the direct coupling between the inputs and outputs of each of the stages and hence to improve rejection. This is because, by symmetry, the capacitive couplings of the input on the output are equal and offset one another.

Figure 11:
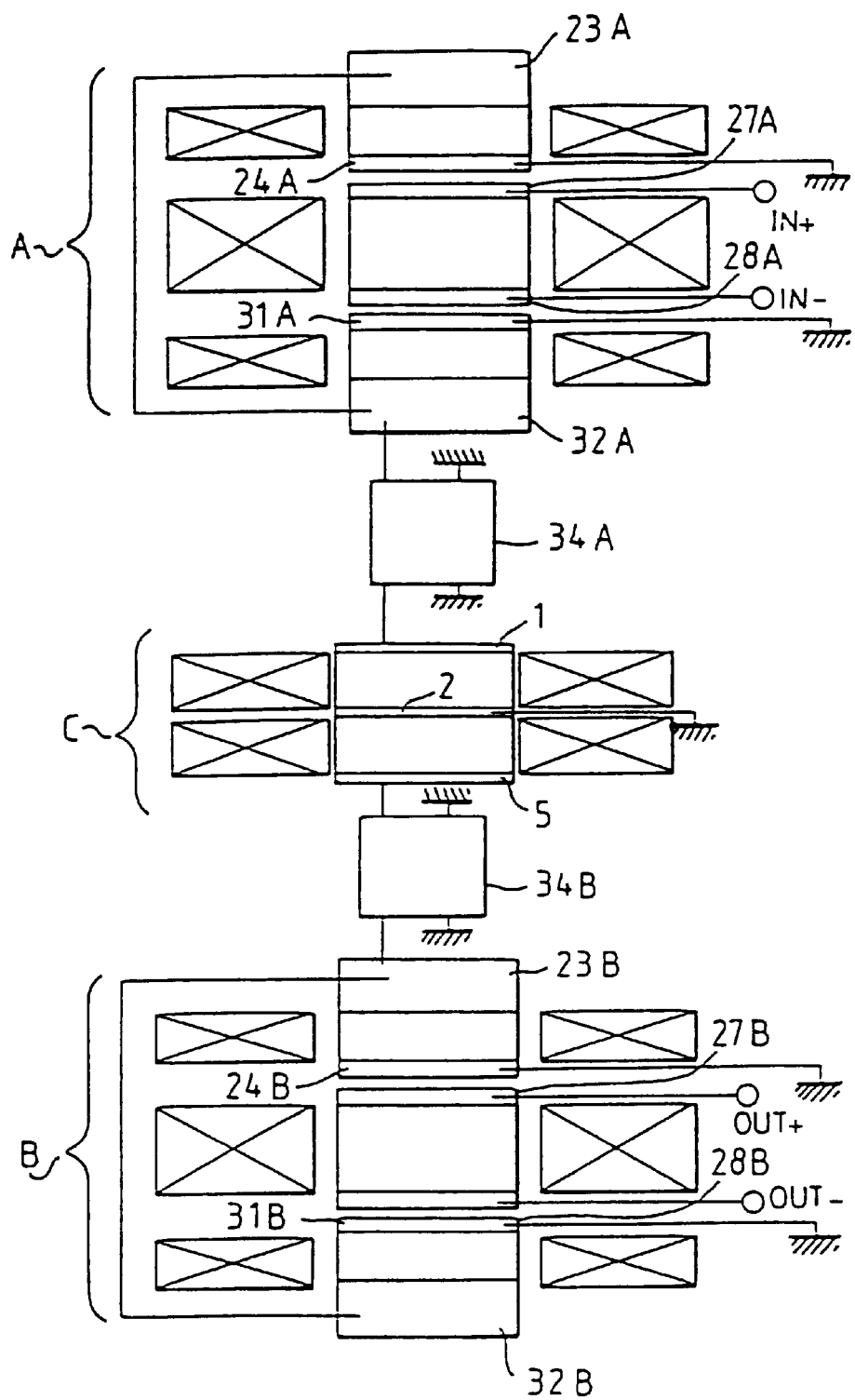

FIG. 11 illustrates a six-pole filter structure according to the invention with differential inputs and outputs. This can be obtained by combining two three-pathway two-pole filters A and B according to the invention with a conventional two-pole filter C with two pathways by way of a first and a second non-differential coupling circuit 34A and 34B. This entirely symmetric structure employs the structure illustrated in FIG. 9. The output of the two-pathway central filter C is coupled to the second stage B by way of the second coupling circuit 34B.

The few examples which have just been described show the use which may be made of the structure of a three-pathway filter according to the invention which is merely a basic brick for multipole filters with resonators. This basic brick can be combined with all types of resonator filters not limited to the structures just described.

We claim:

1. A surface acoustic wave filter having resonators with transverse coupling, comprising three acoustic pathways coupled by proximity, characterized in that:
    a first acoustic pathway made up of a first transducer, comprising a first and a second bonding pad, and arranged between a first reflector and a second reflector, forms a first resonator,
    a second acoustic pathway made up of a second transducer, comprising a third bonding pad and a fourth bonding pad, and arranged between a third reflector and a fourth reflector, forms a second resonator, wherein said second pathway is adjacent to said first pathway, and a third acoustic pathway made up of a third transducer, comprising a fifth and a sixth bonding pad, and arranged between a fifth reflector and a sixth reflector, forms a third resonator, wherein said third pathway is adjacent to said second pathway, and wherein each bonding pad of the transducers is linked to a specified potential and in that the second resonator is connected in differential mode.

2. The filter according to claim 1, characterized in that the second bonding pad and the fifth bonding pad are linked to the same reference potential, in that the third bonding pad is linked to a first differential input and the fourth bonding pad is linked to a second differential input, and in that the first bonding pad and the sixth bonding pad are linked to the output.

3. The filter according to claim 2, characterized in that the three acoustic pathways have a near-identical width.

4. A filter with N poles, with N greater than two, characterized in that it comprises at least one stage consisting of a filter structure according to claim 1.

5. The filter according to claim 4, characterized in that the first bonding pad and the fifth bonding pad of the first stage are linked to a first differential input, in that the second bonding pad and the sixth bonding pad of the first stage are linked to a second differential input, in that the first bonding pad and the fifth bonding pad of the second stage are linked to a first differential output, in that the second bonding pad and the sixth bonding pad of the second stage are linked to a second differential output and, in that the third bonding pad and the fourth bonding pad of the first stage are linked respectively to the third bonding pad and to the fourth bonding pad of the second stage by way of the coupling circuit, so as to produce a four-pole filter with differential inputs and outputs and with differential coupling; the differential inputs and outputs being invertible on account of the symmetry of the filter.

6. The filter according to claim 5, characterized in that the three acoustic pathways have a near-identical width.

7. The filter according to claim 4, further comprising a symmetric filter with two poles with non-differential inputs and outputs comprising a first outer bonding pad and a second outer bonding pad, the first outer bonding pad of the symmetric filter having said two poles being linked to a coupling circuit and the second outer bonding pad being linked to a non-differential output, so as to produce a four-pole filter with differential inputs and non-differential output and with non-differential coupling.

8. The filter according to claim 7, characterized in that the three acoustic pathways have a near-identical width.

9. The filter according to claim 4, characterized in that the first bonding pad of the first stage is linked to the sixth bonding pad of the first stage and to a non-differential input, the first bonding pad of the second stage is linked to the sixth bonding pad of the second stage and to a non-differential output, in that the second bonding pad and the fifth bonding pad of each stage are linked to the same reference potential, and in that the third bonding pad of the first stage and the fourth bonding pad of the first stage are coupled respectively to the third bonding pad and to the fourth bonding pad of the second stage by way of a coupling circuit so as to produce a four-pole filter with non-differential input and output and with differential coupling.

10. The filter according to claim 9, characterized in that the three acoustic pathways have a near-identical width.

11. The filter according to claim 4, characterized in that the first bonding pad of the first stage is linked to the sixth bonding pad of the first stage, the first bonding pad of the second stage is linked to the sixth bonding pad of the second stage, in that the second bonding pad and the fifth bonding pad of the first stage and of the second stage are linked to one and the same reference potential, in that the third bonding pad of the first stage and the fourth bonding pad of the first stage are linked respectively to a first differential input and a second differential input, in that the third bonding pad of the second stage and the fourth bonding pad of the second stage are linked respectively to a first differential output and to a second differential output, and in that the first stage is coupled to the second stage by way of a coupling circuit coupled between the sixth bonding pad of the first stage and the first bonding pad of the second stage, so as to produce a four-pole filter with differential inputs and outputs and with non-differential coupling; the differential inputs and outputs being invertible on account of the symmetry of the filter.

12. The filter according to claim 11, characterized in that a symmetric filter with two poles with non-differential inputs and outputs, and comprising a first outer bonding pad and a second outer bonding pad, is coupled between the first stage and the second stage by way of a first coupling circuit and a second coupling circuit respectively coupled between the sixth bonding pad of the first stage and the first outer bonding pad of the two-pole filter, and between the second outer bonding pad of the two-pole filter and the first bonding pad of the second stage so as to produce a six-pole filter with differential inputs and outputs and with non-differential coupling.

13. The filter according to claim 12, characterized in that the three acoustic pathways have a near-identical width.

14. The filter according to claim 11, characterized in that the three acoustic pathways have a near-identical width.

15. The filter according to claim 4, characterized in that the three acoustic pathways have a near-identical width.

16. The filter according to claim 1, characterized in that the first bonding pad and the fifth bonding pad are linked to a first differential input, while the second bonding pad and the sixth bonding pad are linked to a second differential input, and in that the third bonding pad is linked to a first differential output, while the fourth bonding pad is linked to a second differential output so as to produce a two-pole filter with differential inputs and outputs; the differential inputs and outputs being invertible on account of the symmetry of the filter.

17. The filter according to claim 16, characterized in that the three acoustic pathways have a near-identical width.

18. The filter according to claim 1, characterized in that the three acoustic pathways have a near-identical width.

* * * * *